United States Patent [19]

Wolf

[11] 4,319,359

[45] Mar. 9, 1982

[54] RADIO TRANSMITTER ENERGY RECOVERY SYSTEM

[75] Inventor: Roger E. Wolf, Bridgeville, Pa.

[73] Assignee: RCA Corporation, New York, N.Y.

[21] Appl. No.: 147,575

[22] Filed: May 8, 1980

[30] Foreign Application Priority Data

Apr. 10, 1980 [GB] United Kingdom ............... 11868/80

[51] Int. Cl.³ .............................................. H03K 7/08
[52] U.S. Cl. ......................................... 375/22; 370/9;
332/9 T; 332/37 R; 332/41; 328/111; 307/234;
455/108; 455/127
[58] Field of Search ............ 375/22; 370/9; 332/9 R,
332/9 T, 10, 31 R, 31 T, 37 R, 41; 307/234;
328/111; 329/106; 455/108, 127

[56] References Cited
U.S. PATENT DOCUMENTS

| 1,655,543 | 1/1928 | Heising ................................. 332/15 |
| 3,413,570 | 11/1968 | Bruene et al. ........................ 375/22 |
| 3,486,128 | 12/1969 | Lohrmann ........................... 455/108 |
| 3,506,920 | 4/1970 | Swanson ............................. 455/108 |
| 3,943,446 | 3/1976 | Quidort ............................... 455/108 |
| 4,122,415 | 10/1978 | Luther et al. ...................... 332/37 R |

Primary Examiner—John W. Caldwell, Sr.
Assistant Examiner—Donnie L. Crosland
Attorney, Agent, or Firm—Eugene M. Whitacre; Paul J. Rasmussen; William H. Meise

[57] ABSTRACT

An AM transmitter includes an RF signal generator and a switching-type RF signal amplifier. The RF amplifier output depends upon the energizing voltage applied thereacross, so it acts as a modulator. The energizing voltage is produced by a high-power audio amplifier which includes a pulse-width modulator driving a high-power audio switch. The switch terminals are coupled in series with an audio-frequency filter, energizing terminals of the RF amplifier and a source of direct energizing potential, for varying the voltage across the RF amplifier at an audio rate in response to the duty cycle of the width-modulated pulses for audio modulating the RF carrier. In order to reduce modulation distortion at low duty cycles resulting from the finite turn-on and turn-off time of the audio switch, an offset voltage generator is coupled to the filter by a diode. Energy stored in inductive components of the filter cause a voltage pulse during each turn-off of the audio switch. The voltage pulse is coupled to the offset voltage generator by the diode, and the voltage at the filter is maintained at the offset voltage while current flows in the offset voltage generator and the inductors lose energy. The offset generator includes a capacitor for storing energy resulting from the current flow in the inductor. A DC to AC inverter is coupled to the capacitor and generates alternating voltage. The AC is rectified and a pulsating direct current is coupled to the energizing source for recovering the energy in the inductive pulse.

5 Claims, 2 Drawing Figures

RADIO TRANSMITTER ENERGY RECOVERY SYSTEM

BACKGROUND OF THE INVENTION

This invention relates to an arrangement for improving the efficiency of converting DC input power to radio-frequency output signal of a radio transmitter.

The importance of reducing the waste of energy takes on continually increasing importance. To this end, highly efficient solid-state components have been used in radio transmitters, although in some cases the output stages continue to be the somewhat less efficient thermionic vacuum tubes. In amplitude-modulation transmitters, it is known to use a radio-frequency source by an amount dependent upon the energizing voltage applied across the radio-frequency (RF) power amplifier. The magnitude of the energizing voltage is varied at an audio rate in order to achieve audio modulation of the RF signal. The energizing voltage is varied at an audio rate by an audio-frequency power amplifier, and large amounts of audio-frequency modulating power are required in order to modulate a high-power radio-frequency amplifier.

Class A audio amplifiers have a theoretical maximum conversion efficiency of DC power to AC signal of 50%, and class B amplifiers have a theoretical maximum efficiency of 78.5%. Where large amounts of audio power are involved, significant amounts of energy may be wasted as heat dissipation in the audio amplifier. This has been corrected in the past by the use of so-called class D amplifiers, in which the audio signal to be amplified pulsewidth or pulse-duration modulates a subcarrier. The width-modulated pulses are used to drive a high-power switch-mode amplifier to produce high-power pulses at the subcarrier rate, the duty cycle of which varies at the audio information rate. A low-pass filter coupled to the power switching amplifier integrates the duty-cycle modulated signal to remove the carrier and to reproduce the audio signal. Such amplifiers have a theoretical conversion efficiency approaching 100%.

As described in U.S. Pat. No. 4,122,415 issued Oct. 24, 1978 to A. C. Luther, et al., such switching audio amplifiers may introduce a distortion of the modulating signal during those intervals in which the modulation process produces short-duration pulses having a low duty cycle. This distortion results from the finite switching time of the audio power switch transistors. The aforementioned Luther, et al. patent describes an arrangement for correcting the distortion. The correction arrangement includes a threshold device in the form of a diode coupled to the filter and to an offset voltage source. In one of the embodiments shown in the Luther et al. patent, the offset voltage device is a zener diode. During those intervals in which the power switch is open, the reaction voltage resulting from current flow through the inductances of the low-pass filter of the audio amplifier cause a current flow through the threshold diode and through the zener diode which raises the average voltage applied to the filter in such a manner as to compensate for the modulation distortion caused by the switching time of the switched transistors of the switch-mode amplifier. Another embodiment of the offset voltage source includes a capacitor for storing energy in the form of charge resulting from current flow through the threshold diode, together with a resistor for allowing the voltage across the capacitor to be reduced during the intervals between current pulses. In still another embodiment, the offset voltage source includes a battery or an additional power source. The zener diode and capacitor-resistor embodiments of the offset voltage source dissipate power during operation. The power dissipated may be substantial. The battery embodiment of the offset voltage source is undesirable for reliability reasons, but more importantly it also dissipates power, because a resistor parallel with the battery is necessary to prevent destruction of the battery by increasing without limit the energy stored therein during operation. The power supply embodiment mentioned in the specification of the Luther et al. patent as being equivalent to the battery embodiment is subject to the same disadvantages. A more efficient and reliable radio transmitter is desirable.

SUMMARY OF THE INVENTION

An improved AM generator for transmitting a carrier signal modulated with intelligence from an intelligence signal source includes a pulse-width modulator coupled to the source of intelligence signals for producing recurrent bilevel pulses having a first state and a second state the duration of which depends upon the intelligence. A controllable switch is coupled to the pulse-width modulator for controlling the impedance of a controlled main current path of the switch in first and second states in response to the bilevel pulses. The first state is a high impedance state and the second state is low impedance. The generator includes a radio-frequency modulator for producing radio-frequency signals at an amplitude which depends upon the energizing level applied across first and second terminals of the radio-frequency modulator. The generator also includes an energizing source, and at least an inductance for coupling the first and second terminals of the radio-frequency modulator, the energizing source and the controlled current path in a series path for the flow of current. The inductor develops a voltage pulse during the first state of the switch. The generator includes an offset voltage generator and threshold switch coupling the offset voltage generator to the inductor for allowing current flow in the offset voltage generator for controlling the voltage at the inductor in such a manner as to reduce distortion of the modulation of the carrier signal by the intelligence when the duration of the second state of the controllable switch is low. The improvement lies in that the offset voltage generator includes an energy storage arrangement coupled to a point of reference potential for storing energy as a result of the current flow in the offset voltage generator, and in that the offset voltage generator further includes an energy coupling arrangement for coupling energy from the storage arrangement to the source of energizing potential.

DESCRIPTION OF THE INVENTION

Figure 1:
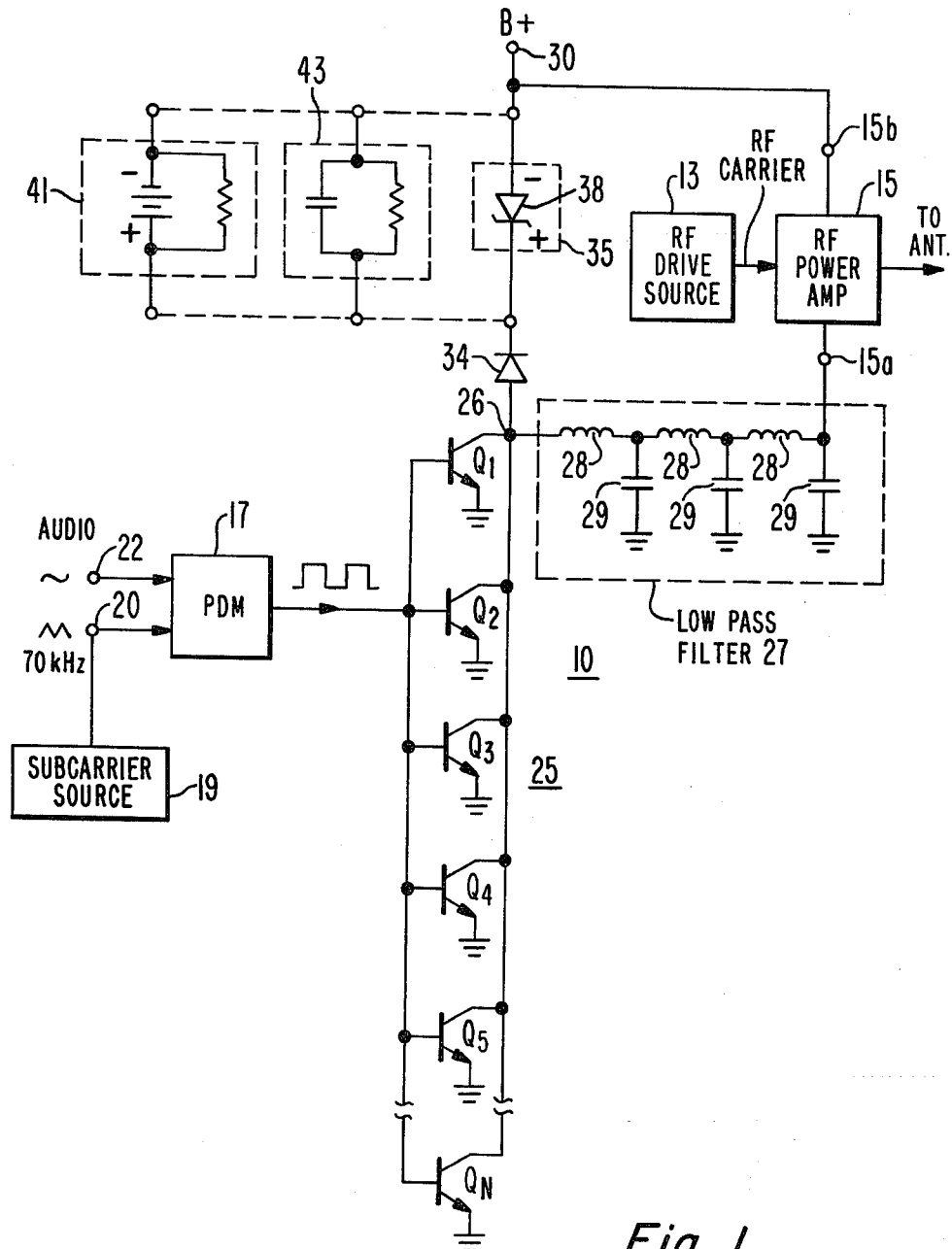
FIG. 1 is a diagram, partially in block and partially in schematic form, of an AM generator or transmitter according to the prior art.

FIG. 1 illustrates a prior art amplitude-modulation (AM) generator or transmitter 10 for producing a carrier signal modulated with intelligence from an audio signal source (not shown). Transmitter 10 includes a radio-frequency (RF) signal generator or drive source 13 which provides a carrier signal at a predetermined radio-frequency carrier frequency. Radio-frequency drive source 13 may include one or more driver amplifiers for increasing the carrier signal power output to the radio-frequency power amplifier, and may also contain phase and amplitude predistortion circuits for compensating for the distortion in later stages. The output of drive source 13 is applied to an RF power amplifier 15, the output of which is fed to a radiating antenna, not shown. The RF carrier being amplified by power amplifier 15 is modulated by the magnitude of the applied energizing potential between energizing terminals 15a and 15b of the amplifier. Terminal 15b is coupled to a terminal 30 to which is applied B+ from a power supply or source of energizing potential (not shown). Terminal 15a is coupled to ground by way of a switching audio power amplifier including a pulse duration modulator (PDM) 17, a power audio switch or switch-mode amplifier 25 and a low-pass filter 27. The RF signal passing through power amplifier 15 is modulated by reconstructed audio applied to terminal 15a.

The audio signal to be modulated onto an RF carrier is applied to an input terminal 22 of PDM 17 from an intelligence or audio signal source, not shown. A subcarrier signal which may have a triangular or sawtooth voltage time waveform is generated by a subcarrier signal source 19 and is coupled to terminal 20 of PDM 17. The triangular subcarrier signal may be of the type illustrated in U.S. Pat. No. 3,943,446 of Quidort. Pulse duration modulator 17 may comprise a comparator such as that described in connection with U.S. Pat. No. 3,943,446 which produces a pulse at the subcarrier frequency the duration or pulse width of which is established by the instantaneous amplitude of the audio signal. Pulse duration modulator 17 may include amplifiers for increasing the power of the pulses to a level suitable for driving the bases of paralleled transistors Q1-Qn of modulation switch 25. Since the pulse rate is constant at the subcarrier rate and the pulse duration varies at the audio rate, the duty cycle is modulated. The emitters of each of parallel-connected transistors Q1-Qn are coupled to ground or to reference potential. The bases of transistors Q1-Qn are coupled to each other and to the output of PDM 17, and the collectors are connected by way of a common point 26 to the input of low-pass filter 27. Filter 27 comprises as is known cascaded sections of series inductance and shunt capacitance, and the end remote from circuit point 26 is the output terminal of the audio amplifier. The output of filter 27 is coupled to terminal 15a. During the positive-going portion of the two-level or bilevel pulses produced by PDM 17, the base-emitter junctions of Q1-Qn are forward-biased and the transistors are turned ON, which represents a low impedance of their main current (collector-emitter) paths.

The circuit as described, without more, will efficiently modulate the RF carrier. The method of modulation may be understood by noting that energizing current flow through power amplifier 15 must flow through filter 27 and through the main current path of switch 25. Switch 25 opens and closes at the subcarrier rate, which may be at a frequency such as 70 kilohertz, with a varying duty cycle depending upon the magnitude of the audio. The low-pass filter averages the duty cycle variations to cause a variable voltage across amplifier 15 at the audio rate to create the desired modulation of the RF carrier.

As described in the aforementioned Luther, et al. patent, at low duty cycles corresponding with low depth of modulation, the modulation linearity may be affected by the switching time of the transistors of switch 25. With short duration pulses applied from PDM 17 to the common bases of the transistors of switch 25 the desired duty cycle is low, but the finite turn-on and turn-off time of switch 25 causes a spreading or stretching of the effective pulse width and an effective increase of the duty cycle from the desired duty cycle. This will result in a compression of the modulated carrier signal compared with the audio modulating signal. This is overcome in the aforementioned patent by the use of an offset voltage generator 35 together with a threshold device in the form of a diode 34. During those intervals in which switch 25 is conductive, current flows through inductors 28 and energy is stored in the magnetic fields associated with the inductor. When switch 25 becomes open or goes to a high-impedance condition, the stored energy creates a voltage which is of such polarity as to cause the current to continue to flow. The voltage at circuit point 26 begins to rise as a result of the inductive energy, and rises until it becomes equal to the sum of the B+ supply voltage, the offset voltage of zener diode 38 and the forward junction voltage of diode 34. Current is then able to circulate through a series path including B+, offset generator 35, diode 34, inductor 28 and filter capacitors 29 until the energy stored in inductor 28 decreases to zero or until switch 25 closes, allowing the current to again begin to increase. During long duty cycle portions of the operation, the average voltage at circuit point 26 is well below B+ and may in fact approach zero volts. This allows maximum current flow through amplifier 15 and corresponds with a maximum carrier level. As the duty cycle becomes shorter, the average voltage at circuit 26 rises until near the shortest duty cycles, the voltage rises above B+ as a result of the mechanism described. The tendency of the average voltage at circuit point 26 to rise above B+ at very short duty cycles tends to cause the voltage at terminal 15a to rise to B+ notwithstanding the finite switching times of transistors Q1-Qn. With terminal 15a at B+, the difference voltage applied across the energizing terminals of power amplifier 15 is zero, and the amplifier is completely deenergized and incapable of producing any carrier. Thus, threshold device 34 in conjunction with offset voltage generator 35 compensates for the residual carrier which results at low duty cycles from the finite switching characteristics of switch 25.

The current flow through diode 34 and through zener diode 38 represents, as mentioned, a power which is converted to heat. Similarly, the alternative embodiments of the offset voltage generator of FIG. 1 dissipate as heat the power resulting from the flow of current therethrough. The amount of power dissipated as heat may be considerable.

Figure 2:
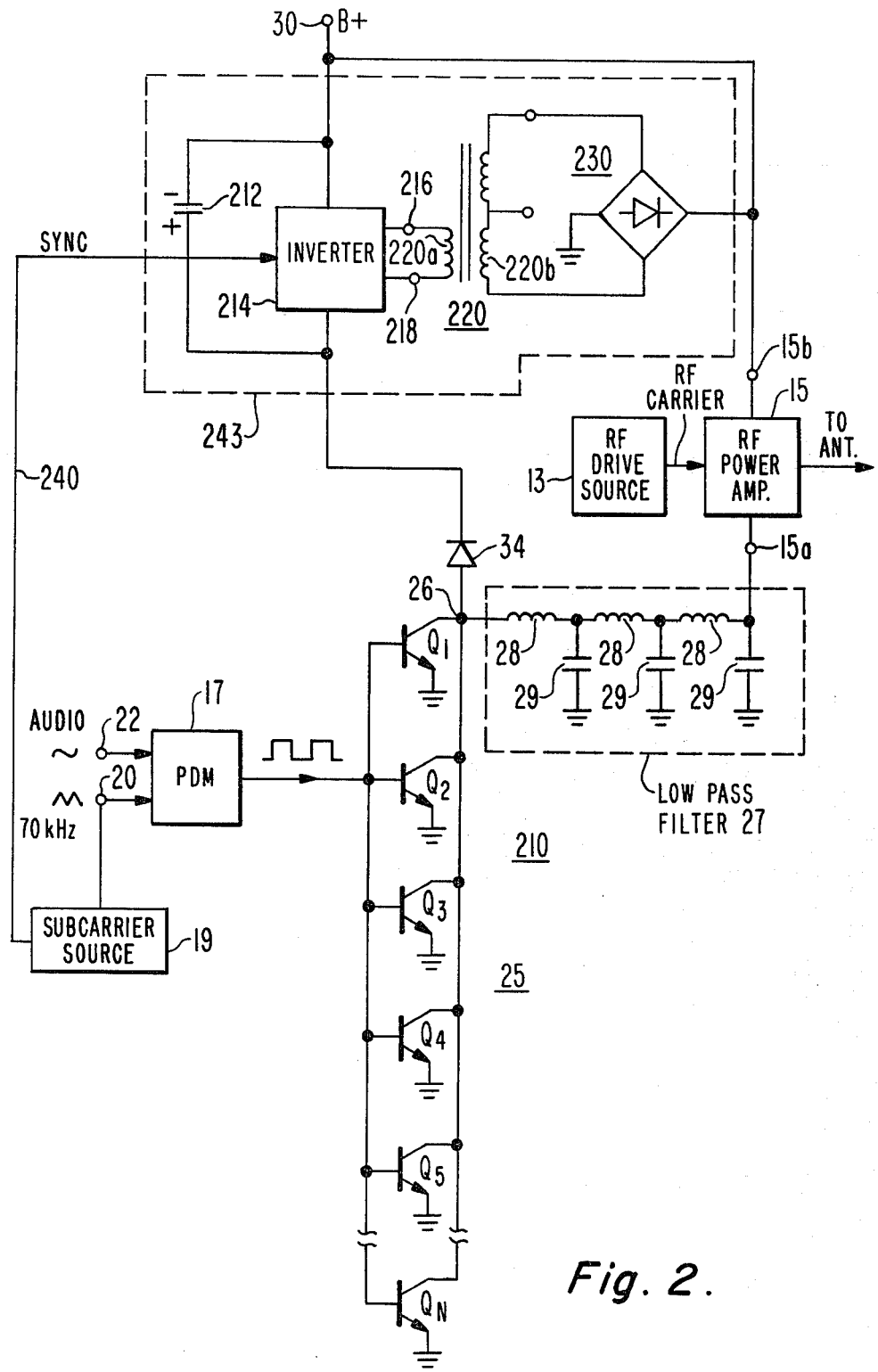
FIG. 2 illustrates a generator embodying the invention.

FIG. 2 illustrates a transmitter 210 embodying the invention. In FIG. 2, elements corresponding to those of FIG. 1 have the same reference number. In FIG. 2, the RF drive source, RF power amplifier, audio amplifier and threshold diode 34 are identical with those of FIG. 1. The offset voltage generator is illustrated as a block 243 and includes a capacitor 212 which responds to the flow of current through diode 34 to produce a voltage of the polarity shown. Comparison of the polarity with the polarity illustrated in FIG. 1 shows that the offset voltage is in the same direction as that produced by zener diode 38. Capacitor 212 stores an increasing amount of energy with time, as the periodic opening and closing of switch 25 causes periodic pulses of unidirectional current through threshold diode 34 as a result of the energy periodically stored in inductor 28. As mentioned, if allowed to continue, the voltage across capacitor 212 would rise continually. This is undesirable because it might damage the capacitor or other components, and it continually changes the operating state of the modulator. Consequently, a DC-to-AC inverter illustrated as a block 214 is coupled across the terminals of capacitor 212. Inverter 214 may be of any known type suitable for accepting direct current from capacitor 212 and for producing an alternating voltage across output terminals 216 and 218. The primary winding 220a of a voltage step-up transformer 220 is coupled across terminals 216 and 218 for being energized by the alternating voltage produced by inverter 214. The stepped-up voltage appearing across a secondary winding 220b of transformer 220 is applied across a pair of terminals of a bridge rectifier designated generally as 230. Another terminal of bridge rectifier 230 is grounded, and the fourth terminal is connected to terminal 30, the source of B+ energizing potential.

In operation, the voltage across capacitor 212 is controlled by drawing charge from the capacitor in the form of current flow through inverter 214. The energy represented by this flow of direct current through inverter 214 is converted to the form of an alternating current applied to winding 220a, and is further transformed by transformer 220 to high-voltage secondary 220b. On the secondary side, a pulsating direct current is formed by rectifier 230 and the pulsating direct current is applied by way of terminal 30 to the source of B+. The flow of current through the source of B+ as a result of the operation of inverter 214, transformer 220 and rectifier 230 is in a direction to restore energy to the source. Thus, the energy which in the prior art was wasted as heat in the offset voltage generator is in the arrangement of FIG. 2 returned to B+, the energizing source.

Various taps are provided on secondary winding 220b to which rectifier 230 may be connected to better match the transformed voltage produced by inverter 214 to the value of the B+ voltage.

The operation of inverter 214 to produce a pulsating direct current through terminal 30 to source B+ of energizing voltage causes a fluctuation of the B+ at twice the alternating-current frequency of inverter 214. This voltage fluctuation is caused by the flow of the pulsating direct current through the internal resistance of the B+ supply. This unavoidable pulsating voltage appears at terminal 15b and will result in a residual modulation of the carrier by power amplifier 15. Similarly, low-pass filter 27 cannot remove every vestige of the subcarrier signal from the audio signal appearing at terminal 15a, and the RF carrier has residual modulation at the subcarrier rate. If the frequency of the inverter is not controlled, the frequency may vary as the voltage across capacitor 212 varies. The interaction of the residual modulations due to the inverter-induced B+ variations and to the unfiltered subcarrier signals may interact to cause audible beat notes of low amplitude. In order to avoid such beats, inverter 214 may be synchronized with the subcarrier by means of a conductor 240. In this manner, inverter 216 may be locked to a multiple or submultiple of subcarrier frequency for preventing changes in the difference frequency which may result in audible whistles. Such synchronization is well-known in the art and requires no further explanation.

What is claimed is:

1. An improved AM generator for producing a carrier signal modulated with intelligence from an intelligence signal source, comprising:
   a pulse-width modulation means coupled to said source of intelligence signals for producing recurrent bilevel pulses the duration of which depends upon said intelligence;
   controllable switch means coupled to said pulse-width modulation means for controlling the impedance of a controlled main current path of said controllable switch means in first and second states in response to said bilevel pulses, said first state being high impedance and said second state being low impedance;
   a radio-frequency modulator having first and second terminals for producing radio-frequency signals at an amplitude dependent upon the energizing level applied across said first and second terminals;
   an energizing source;
   inductive means coupling said first and second terminals of said radio-frequency modulator, said energizing source and said controlled current path in a series path for the flow of current, said inductive means developing a voltage pulse during said first state;
   offset voltage generating means;
   threshold switching means coupled to said inductive means and to said offset voltage generating means for allowing current flow in said offset voltage generating means for controlling the voltage at said inductive means in such a manner as to reduce distortion of the modulation of said carrier signal by said intelligence when the duration of said second state is low;
   wherein the improvement lies in that said offset voltage generating means comprises energy storage means coupled to a point of reference potential for storing energy as a result of said current flow in said offset voltage generating means; and
   wherein said offset voltage generator further comprises energy coupling means for coupling energy from said storage means to said source of energizing potential.

2. A generator according to claim 1 wherein said energy storage means comprises capacitance means coupled for storing energy in the form of charge, thereby developing a direct voltage across the terminals of said capacitance means.

3. A generator according to claim 2 wherein said energy coupling means comprises a direct-voltage-to alternating-voltage inverter, the direct-voltage input of which is coupled with said capacitance means for being energized by said direct voltage for generating at an output terminal said alternating voltage.

4. A generator according to claim 3 further comprising rectifying means; and
   coupling means for coupling said rectifying means with said source of energizing potential for rectifying said alternating voltage to produce a pulsating direct current through said source of energizing potential for transferring energy from said output terminal of said inverter to said source of energizing potential.

5. A generator according to claim 4 wherein said coupling means comprises a voltage step-up transformer.

* * * * *